United States Patent
Campagna et al.

(10) Patent No.: US 7,145,338 B2
(45) Date of Patent: Dec. 5, 2006

(54) METHOD FOR IMPLEMENTATION OF A MAGNETIC RESONANCE EXAMINATION OF A PATIENT

(75) Inventors: Swen Campagna, Engelthal (DE); Martin Harder, Nürnberg (DE); Peter Heubes, Poxdorf (DE); Rainer Kaim, Obermichelbach (DE); Stephan Kannengiesser, Erlangen (DE); Berthold Kiefer, Erlangen (DE); Cecile Mohr, Erlangen (DE); Katrin Wohlfarth, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/126,691

(22) Filed: May 11, 2005

(65) Prior Publication Data

US 2005/0264288 A1    Dec. 1, 2005

(30) Foreign Application Priority Data

May 11, 2004   (DE) .................. 10 2004 023 203
Apr. 28, 2005  (DE) .................. 10 2005 019 859

(51) Int. Cl.
*G01V 3/00*    (2006.01)
(52) U.S. Cl. ...................... 324/318; 324/322
(58) Field of Classification Search ............... 324/318, 324/322, 307, 309
See application file for complete search history.

(56) References Cited

U.S. PATENT DOCUMENTS

| | | | |
|---|---|---|---|
| 5,525,905 A * | 6/1996 | Mohapatra et al. ......... 324/318 |
| 6,414,486 B1 | 7/2002 | Koeliner et al. |
| 6,580,937 B1 * | 6/2003 | Ho et al. .................... 600/415 |
| 6,675,039 B1 * | 1/2004 | Heckel et al. ............... 600/425 |
| 6,828,787 B1 * | 12/2004 | Oesingmann ................ 324/307 |
| 2003/0098688 A1 | 5/2003 | Brinker et al. |

FOREIGN PATENT DOCUMENTS

WO    WO 02/082996    11/2002

OTHER PUBLICATIONS

Helical MR: Continuously Moving Table Axial Imaging With Radial Acquisitions—Shankaranarayanan et al—Magnetic Resonance in Medicine—vol. 50 (2003) pp. 1053-1060.

* cited by examiner

*Primary Examiner*—Louis M. Arana
(74) *Attorney, Agent, or Firm*—Schiff Hardin, LLP

(57) ABSTRACT

In a method for implementation of a magnetic resonance examination of a patient with an imaging medical magnetic resonance apparatus with a movable patient bed, for of an examination volume of the patient that is larger than an acquisition volume of the magnetic resonance apparatus, anatomical patient information and second technical information for setting the magnetic resonance apparatus are acquired dependent on the position of the patient bed from magnetic resonance signals acquired in a low-resolution calibration measurement (scan). A first group of measurement protocol parameters is generated from the patient information and a second group of measurement protocol parameters is generated from the technical information, to generate a measurement protocol for a subsequent high-resolution magnetic resonance examination.

19 Claims, 2 Drawing Sheets

METHOD FOR IMPLEMENTATION OF A MAGNETIC RESONANCE EXAMINATION OF A PATIENT

BACKGROUND OF THE INVENTION

1. Field of the Invention

The present invention concerns a method for implementation of a magnetic resonance examination of a patient with an imaging medical magnetic resonance apparatus with a movable patient bed, wherein an examination volume of the patient to be examined is larger than the acquisition volume of the magnetic resonance apparatus.

2. Description of the Prior Art

A goal of magnetic resonance tomography and magnetic resonance spectroscopy is to implement patient examinations that are ever shorter and are conducted with stronger gradient magnetic fields that are produced with shorter gradient field systems (coils). A problem occurs in the examination of larger body regions, such as the entire patient or non-contiguous regions thereof, because the acquisition volume in the MR scanner becomes smaller as the gradient field system becomes shorter. The magnetic resonance apparatuses (MR scanners) that are advantageous with regard to interventional diagnoses and with regard to the increased patient comfort thus place new requirements on the process of an examination with such a magnetic resonance apparatus. The problem of conducting an examination of an examination region that cannot be acquired with a local acquisition is solved by moving the patient through the acquisition volume by means of a movable patient bed. The movement can ensue in steps or continuously. In the former case conventional, local acquisition techniques for an a non-moving subject can be used.

A method for data acquisition of a large acquisition volume using a continuously moving patient bed is known from PCT Application WO 02/082996. A seamless image of the acquisition region is thereby acquired.

Imaging with a continuous movement of the patient bed (acquisition of a moving subject) is, for example, known from "Helical MR: Continuously Moving Table Axial Imaging With Radial Acquisitions", A. Shankaranarayanan et al., Magnetic Resonance in Medicine, 50; 1053 to 1060, 2003.

The conventional magnetic resonance technique deals with local examinations of individual body regions in the isocenter of the basic field magnets, i.e. in the region of the highest homogeneity of the basic magnetic field. If various body regions should be measured, the patient is either shifted with the aid of the patient bed or is repositioned. After each shifting, multiple position-dependent parameters are re-detected in a localizer measurement (scan) in order to derive a measurement protocol therefrom. Measurement planning over the entire patient region thus is not possible. If various regions are measured, the dwell time of the patient in the magnetic resonance apparatus is prolonged due to the respective localizer measurements being re-implemented.

In addition to fundamental adjustment parameters of the apparatus, to an increasing degree calibration measurements are necessary for implementation of magnetic resonance examinations. These enable the determination of sensitivity profiles of coils that can be used for image brightness compensation, for parallel imaging or for coil position determination. Furthermore, distributions of the basic magnetic field, the radio frequency field and/or gradient magnetic fields can be determined for correction of, for example, gradient echo images.

In connection with magnetic resonance measurements with a continuously moving patient bed, in the aforementioned article "Helical MR: Continuously Moving Table Axial Imaging With Radial Acquisitions" it is noted that more precise technical measurement parameters could be acquired with localizer measurements for various positions of the patient bed in order to improve the image quality. For this purpose, it is proposed to acquire (in a preceding measurement) and store shim values, the center frequency of the MR excitation, and reception and transmission amplifications for various body parts. These discrete values can then be interpolated and adapted as necessary as the different body parts move through the acquisition region.

A method for determination of measurement values with adherence to SAR limit values is known from German OS 101 50 138, in which the bed and therewith the adjusted field of view is moved relative to the transmission antenna. The position of the patient is determined by pattern recognition from the associated pre-measurements and is used for calculation of SAR values. A disadvantage of this method is that the acquired valued is valid only for a specific table position. Indeed, this value can quite significantly change given a small table shift.

SUMMARY OF THE INVENTION

An object of the present invention is to provide a method for implementing a magnetic resonance examination that solves the problems in an examination of the examination region that cannot be scanned with a local measurement because it is, for example, larger than the acquisition volume of the magnetic resonance apparatus that is used. In particular the necessary measurement time should thereby be shortened and the image quality should be increased.

This object is achieved in accordance with the invention by a method for Implementation of a magnetic resonance examination of a patient with an imaging medical magnetic resonance apparatus with a movable patient bed; the patient to be examined being positioned on the patient bed, wherein a low-resolution calibration measurement (data acquisition) is implemented in which the examination region is shifted through the acquisition region with a continuous shifting of the patient bed. First anatomical patient information and second technical information for adjustment of the magnetic resonance apparatus are acquired from the thereby-received magnetic resonance signals, dependent on the position of the patient bed. A first group of measurement protocol parameters is generated from the patient information and a second group of measurement protocol parameters is generated from the technical information. The first and second groups are in turn used for creation of a measurement protocol with which a high-resolution magnetic resonance examination of the examination region subsequently ensues.

An advantage of the invention is that the necessary information is acquired continuously over the examination region in a simple manner. In order to achieve this with the method known from German OS 101 50 138, for example, a whole-body scan over 2 meters would have to be implemented in intervals of, for example, 3 cm measurements of approximately 10 s measurement duration each. This can be implemented in 0.5 to 20 min in accordance with the invention with a measurement with continuous table movement. This time gain allows a higher resolution in the table shift direction, since in principle each table position can be evaluated. The piecing together of axial measurement regions and the errors associated with this procedure are omitted. Furthermore, an advantage is that the spatial resolution can be individually adapted to the various items of partial information. Thus, for example, the transmitter reference amplitude can be doubled as often as the shim parameters are acquired.

A further advantage is that parameters can be determined from M continuously measured data sets of a measurement N>M (in contrast to a stationary measurement in which only the current parameter of interest is measured). Furthermore, the measurements at different locations (i.e. patient bed moved in to different lengths) can be related to one another, for example in order to smooth (average) the curve of measurement values in the z-direction (i.e. the shift direction of the patient bed) to compensate measurement imprecisions of each individual measurement or to make a "prediction" of a new measurement value range from data already acquired.

Another advantage of the invention is that information is determined in the framework of the low-resolution calibration measurement, which information can be used to automate steps that were previously manually implemented, such as, for example, parts of the patient registration, the measurement preparation and/or the measurement itself. The measurement time is thereby shortened overall and the image quality is increased. The time invested in the calibration measurement thus subsequently leads to a time saving and an effective implementation of the magnetic resonance examination.

In an embodiment, a third group of measurement protocol parameters is calculated from the patient information and the technical information. For example, this enables the use of a position-dependent patient-related SAR prediction in the measurement protocol creation and SAR monitoring in the later measurement (SAR: specific absorption rate). An exact, SAR determined with positional dependence enables the optimal radiation of radio frequency magnetic fields. In the case of a shift of different regions of the patient through the acquisition region, this exact SAR measured on the body is absolutely necessary in order to not have to conservatively irradiate, whereby the signal and therewith the contrast would decrease.

The method according to the invention refers to a non-local patient examination in which the examination region to be examined is larger than the acquisition region (given by the region of highest homogeneity (isocenter) of the magnet). The term "larger" as used herein encompasses the situation in which the examination region has sub-regions, which do not necessarily have to be connected with one another and of which one or more are smaller than the acquisition region, but that cannot be acquired together with one local measurement. Since technical parameters of the magnetic resonance apparatus as well as patient information necessary for measurement planning change dependent on the position of the patient bed and the position of the patient relative to the acquisition volume, a measurement (data acquisition) planning only with regard to the acquisition region is not sufficient to adjust an optimal imaging for the larger examination volume to be imaged. As used herein "technical parameters" of the magnetic resonance apparatus are, for example, the basic magnetic field homogeneity, possible shim parameters, the center frequency of the radio frequency magnetic field, and the transmission and reception power of the radio frequency magnetic field. As used herein "patient information" encompasses, among other things, the measurements of the patient (such as length and weight) as well as the position of an organ or body part of interest in relation to the patient bed or in relation to the acquisition volume.

In accordance with the invention an optimally fast calibration measurement with a low resolution can be implemented one time before the actual high-resolution magnetic resonance examination, and additional patient information, which can be determined only based on the shifting of the patient is acquired in an expansion of the measurements known as pre-scan measurements. This calibration measurement is implemented after a concluded patient positioning which, for example, includes the patient placement and, if applicable, the application of the radio frequency coils, the PMU units and/or placement of possible contrast agent injection needles.

The patient is continuously shifted through the acquisition region once during the calibration measurement with the automatic table shift. Magnetic resonance measurements (data acquisitions or scans) are thereby implemented, i.e. magnetic resonance signals are excited and subsequently received. The patient information and the technical information are acquired from the magnetic resonance signals thereby acquired during the shifting of the patient bed in order to determine therefrom a series of measurement protocol parameters that do not change during the subsequent high-resolution magnetic resonance examination of the patient, or the position-dependence of which is known and therefore can be used for all subsequent measurements.

The following methods for patient and technical information acquisition and measurement protocol parameter determination, for example, can be integrated into the calibration measurement:

A) Patient Information:

An automatic whole-body locallzer that exists in the form of a number of slice planes or as a complete 3D data set and gives a fast overview about the rough anatomy/vessels of the patient. Specific whole-body examinations can be automatically or manually set up based on such a localizer measurement, for example in the form of reconstructed slice images or as MIP images (MIP: Maximum Intensity Projection).

The contour of the patient can be automatically determined from the data sets of the examination region, and for example the length of the patient as well as his or her alignment in the MR apparatus (head or feet first) as well as the patient's weight can be determined from this as measurement protocol parameters. These measurement protocol parameters can be automatically incorporated into the measurement protocol and thus accelerate the patient registration. In addition to the time saving, important data (for example relevant for the SAR) can be included in the creation of the measurement protocol in this manner.

For example, simplified examinations of individual regions can be implemented according to focal points with the aid of an automatic detection of body parts and organs of the human body without, for example, having to correspondingly reposition the patient in the acquisition volume with the use of a light-beam localizer.

B) Technical Information:

An automatic acquisition of distributions of a basic magnetic field and/or radio frequency magnetic field and/or gradient magnetic field enables the correction of deviations by means of shim parameters in the measurement protocol and in the subsequent correction of the Image data, for example by correction of the k-space trajectory given non-Cartesian measurements.

An absorption rate of the patient is determined exactly dependent on the patient bed position in the creation of an exact load profile of the examination region to be examined. Due to the high resolution in comparison with individual measurements, an average of the radio frequency transmission capacity resulting from this is less susceptible to intrinsically present strong temporal and spatial fluctuations of individual measurement points. The transmission capacity thus can be determined more precisely and an improved accounting of the SAR is possible. With inclusion of additional patient information, for example size and weight, an SAR calculation model can be used that accounts for the position of the patient and thus always adapts to the respective body region located in the acquisition region. Among other things, this also enables an optimization of the examination sequence using an improved SAR prediction possibility.

An automatic coil detection that detects the position of a coil in relation to the patient bed and—using patient information—in relation to the patient body and thus, for example, enables the generation and use of a database with which reliable and automated coils can be selected for local and non-local examinations with movable patient bed.

An additional automatic acquisition of coil sensitivity profiles can be used, for example, in normalization algorithms for parallel imaging (PAT). The patient and technical information can be virtually simultaneously acquired by means of a magnetic resonance measurement.

In an embodiment, a series of magnetic resonance measurements which respectively excite magnetic resonance signals is implemented with the continuous shifting of the patient bed. In such a series, magnetic resonance measurements for acquisition of patient information and magnetic resonance measurements for acquisition of technical information are nested or interleaved with one another. This means that a group of at least one magnetic resonance measurement for acquisition of technical information follows a group of at least one magnetic resonance measurement for acquisition of patient information, followed again by a group of at least one magnetic resonance measurement for acquisition of patient information, and so on. For example, an imaging measurement and three measurements (respectively for determination of the resonance frequency, the transmitter frequency amplitudes and the reflection behavior of the magnetic resonance apparatus) can respectively alternate during the continuous shifting. In addition to the directly determined quantities, SAR values and the load profile, etc. are also determined.

DESCRIPTION OF THE PREFERRED EMBODIMENTS

Figure 1:
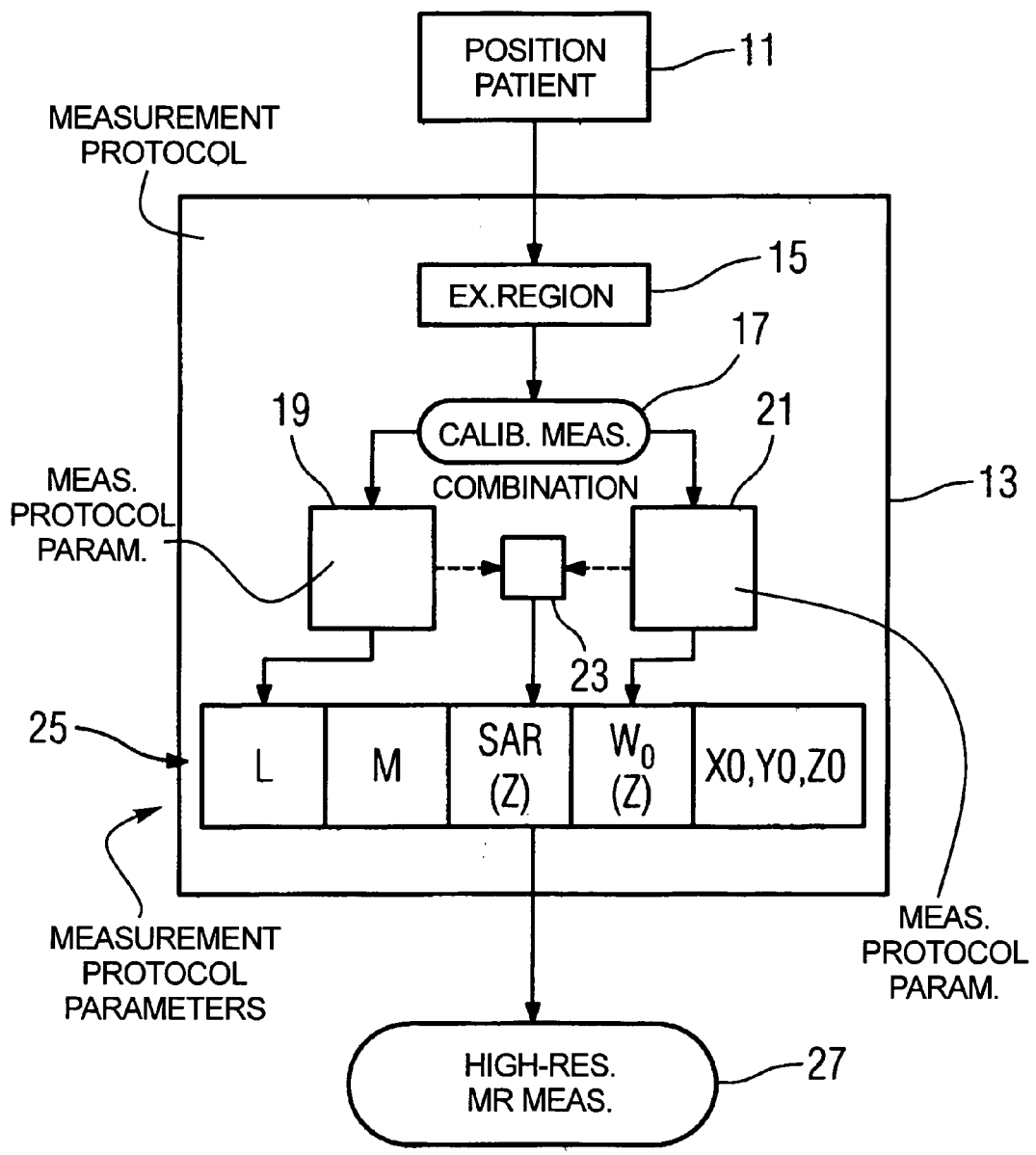
FIG. 1 is a flowchart of an embodiment of the method.
Figure 2:
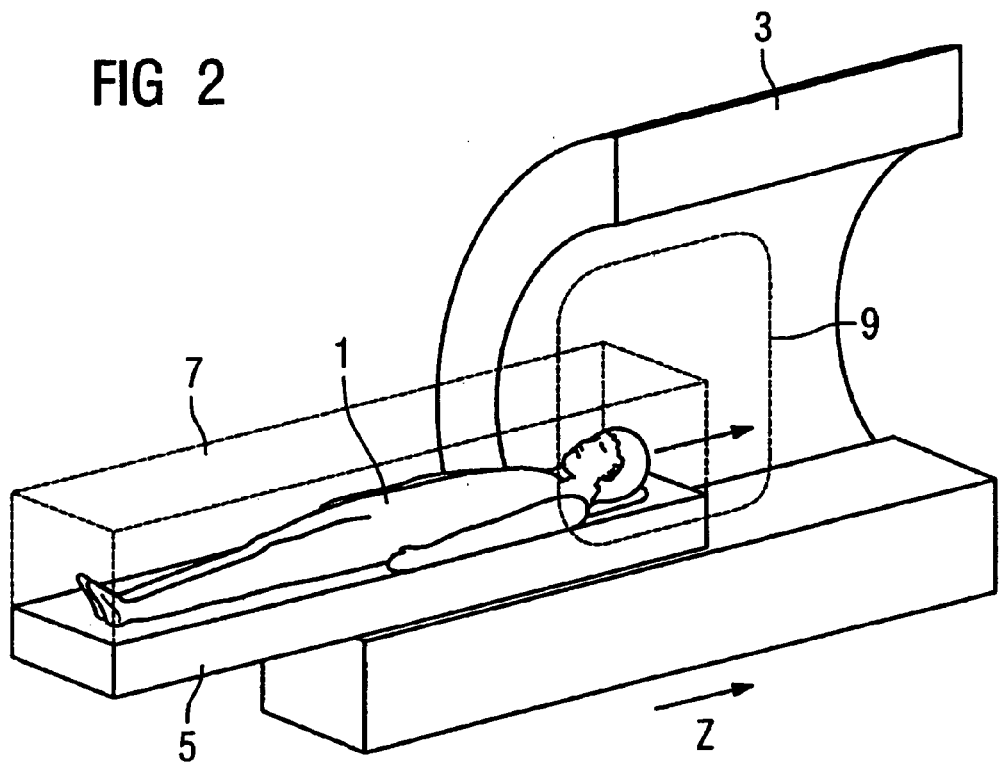
FIG. 2 is a schematic illustration of a magnetic resonance apparatus for implementation of the inventive method.

FIG. 1 shows a flowchart of an exemplary embodiment of the method according to the invention. FIG. 2 shows an apparatus to implement the method. A patient 1 is to be "non-locally" examined with a magnetic resonance apparatus 3 that has a movable patient bed 5. "Non-locally" thereby means that an examination volume 7 is larger than an acquisition volume 9 of the magnetic resonance apparatus 3.

The patient 1 on the patient bed 5 is moved in the z-direction (i.e. in the axial direction) through the acquisition volume 9 of the magnetic resonance apparatus 3 for acquisition of data from the entire examination volume 7.

The examination of the patient 1 ensues as follows. First, a positioning 11 of the patient 1 on the patient bed 5 occurs. As needed, local radio frequency coils may also positioned on the body of the patient 1. A measurement protocol 13 is subsequently created, wherein an establishment 15 of the examination region 7 ensues. For example, "whole body" could be set as a default of the examination volume. In this case, an input by the user would only be necessary if the examination region should be limited in the z-direction. If additional auxiliary means such as a light-beam localizer or an MR-visible reference marker are present, the establishment 15 of the examination region could ensue before the positioning 11 of the patient 1.

A low-resolution calibration measurement 17 is now implemented in the set examination volume 7. In at least one magnetic resonance measurement, radio frequency pulses are radiated and magnetic resonance signals are read while, at the same time, the patient 1 on the patient bed 5 is continuously moved through the acquisition region 9. Anatomical patient information 19 and technical information 21 are acquired from the magnetic resonance signals dependent on the position of the patient bed 5. The latter are, among other things, necessary for setting of technical parameters of the magnetic resonance apparatus 3.

Measurement protocol parameters 25 are derived from this information, the measurement protocol parameters 25 being either independent of the patient bed position (for example length of the patient, weight of the patient) or dependent on the z-position of the patient bed, for example the central frequency of the radio frequency field to be radiated. Furthermore, a third group of measurement protocol parameters 25 can be calculated as a combination 23 of the anatomical information 21 and the patient information 19, for example the z-dependent SAR calculation.

Position-dependent measurement protocol parameters 25 can be stored in a databank either discretely or as a function of the location Z in order to be able to recall them in a following magnetic resonance examination 27.

Further measurement protocol parameters 25 can be entered by an operator based on an MR image created from the low-resolution calibration measurement 17. For example, the limits X0, Y0, Z0 of the examination region 7 can be corrected or examination volumes can be selected according to focal points using this MR image.

The high-resolution magnetic resonance examination 27 of the examination region 7 is subsequently implemented using the measurement protocol 13 and the (in part automatically and in part manually) entered measurement protocol parameters 25.

Figure 3:
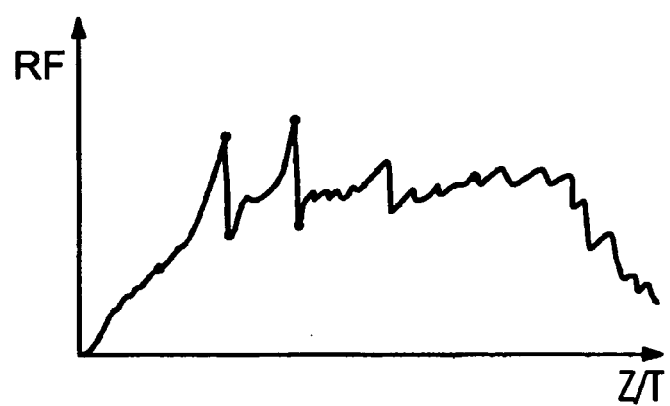
FIG. 3 schematically illustrates a curve of the spatiotemporal radio frequency transmission power.

FIG. 3 shows an example of the curve of the radio frequency transmission power RF dependent on the axial coordinate Z or the time T. Large fluctuations that would lead to significant errors in a random local measurement of a few points (for example in a SAR value calculated from them) can be recognized. A finely-resolved, position-dependent determination of the SAR value can now be achieved with the method according to the invention, for example with an averaging so the strong fluctuations do not enter into the SAR value. An averaging or smoothing of the curve is easily possible based on the many data points.

For SAR calculation and in particular for monitoring of legal limit values, it is important to know, for example, the position of the head on the bed, since the SAR values for the head are lower than for the whole body. For example, it is thus advantageous to determine the alignment of the patient in the MR apparatus as anatomical information. Since an SAR value basically corresponds to the ratio of the radiated capacity to the mass, the total weight of the patient (which can likewise be acquired as anatomical information from the MR signals) enters into the SAR calculation. Local SAR values also can be specifically determined over the length and/or the mass distribution as anatomical information.

Although modifications and changes may be suggested by those skilled in the art, it is the intention of the inventors to embody within the patent warranted hereon all changes and modifications as reasonably and properly come within the scope of their contribution to the art.

We claim:

1. A method for implementing a magnetic resonance examination using an imaging magnetic resonance apparatus having an imaging data acquisition volume and movable patient bed, to acquire magnetic resonance data from an examination volume of the patient that is larger than said acquisition volume, comprising the steps of positioning the patient on the patient bed;

implementing a low-resolution calibration measurement by shifting said examination volume through the acquisition volume by continuously moving said patient bed to acquire magnetic resonance signals from the patient, and from said magnetic resonance signals, determining anatomical patient information and technical information, for adjusting said magnetic resonance apparatus dependent on the position of the patient bed;

generating a first group of measurement protocol parameters from patient information;

generating a second group of measurement protocol parameters from said technical information;

generating a measurement protocol from said first and second groups of measurement protocol parameters; and implementing a high-resolution diagnostic magnetic resonance measurement of said examination volume using said measurement protocol.

2. A method as claimed in claim 1 comprising generating a third group of measurement protocol parameters by combining said patient information and said technical information.

3. A method as claimed in claim 2 wherein said third group of measurement protocol parameters comprises at least one of a load profile and an SAR value profile.

4. A method as claimed in claim 1 comprising continuously acquiring said patient information and said technical information while said patient bed is being continuously moved, by exciting magnetic resonance signals in the patient.

5. A method as claimed in claim 1 comprising, while continuously moving said patient bed, implementing a plurality of successive magnetic resonance measurements as said low-resolution calibration measurement, by exciting magnetic resonance signals in the patient in each of said successive magnetic resonance measurements and acquiring said patient information and said technical information in respective ones of said successive magnetic resonance measurements that are interleaved with each other.

6. A method as claimed in claim 5 comprising implementing N>0 magnetic resonance measurements for acquiring said technical information interleaved with M>0 magnetic resonance measurements for acquiring said patient information.

7. A method as claimed in claim 1 comprising acquiring a low-resolution magnetic resonance image of said examination volume as said patient information.

8. A method as claimed in claim 7 comprising, from said low-resolution magnetic resonance image, determining body measurements of the patient including at least one of a length of the patient and a weight of the patient.

9. A method as claimed in claim 1 comprising detecting alignment of the patient with regard to the head of the patient, in the magnetic resonance apparatus as said patient information.

10. A method as claimed in claim 1 comprising determining an organ of the patient in relation to the patient bed as said patient information.

11. A method as claimed in claim 1 wherein said measurement protocol includes a patient registration, and entering said patient information into said patient registration.

12. A method as claimed in claim 1 comprising determining a radio frequency transmission capacity of the patient dependent on the position of the patient bed as said technical information.

13. A method as claimed in claim 1 comprising acquiring information, dependent on the position of the patient bed, as said technical information, selected from the group consisting of distribution of a basic magnetic field in the magnetic resonance apparatus, distribution of a radio frequency field in the magnetic resonance apparatus and distribution of a gradient magnetic field in the magnetic resonance apparatus.

14. A method as claimed in claim 1 comprising generating parameters for setting magnetic field shimming dependent on the position of the patient bed as said measurement protocol parameters.

15. A method as claimed in claim 1 comprising generating parameters for image processing dependent on the position of the patient bed as said measurement protocol parameters.

16. A method as claimed in claim 1 comprising generating parameters associated with a specific patient absorption rate (SAR) dependent on the position of the patient bed as said measurement protocol parameters.

17. A method as claimed in claim 1 comprising calculating a position of a local coil, to be used in said high-resolution magnetic resonance examination, dependent on the position of said patient bed as a measurement protocol parameter.

18. A method as claimed in claim 1 comprising individually storing at least one of said measurement protocol parameters dependent on the position of the patient bed.

19. A method as claimed in claim 1 comprising storing at least one of said measurement protocol parameters as a function dependent on the position of the patient bed.

* * * * *